(12) United States Patent
Chao et al.

(10) Patent No.: US 6,629,045 B2
(45) Date of Patent: Sep. 30, 2003

(54) SYSTEM AND METHOD FOR DETECTING SLAVE POWER SUPPLY FAILURE

(75) Inventors: Chang-Hui Chao, Hsin-Chu (TW);
Wen-Huang Chiang, Hsin-Chu (TW);
Hong-Yi Chang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 149 days.

(21) Appl. No.: 09/812,040

(22) Filed: Mar. 19, 2001

(65) Prior Publication Data

US 2002/0133305 A1 Sep. 19, 2002

(51) Int. Cl.$^7$ .................................................. G06F 1/28
(52) U.S. Cl. ............................ 702/60; 324/771; 714/14
(58) Field of Search ...................... 324/771; 340/693.1, 340/693.2; 702/60, 62; 307/60, 43, 64; 714/14

(56) References Cited

U.S. PATENT DOCUMENTS

| | | | | |
|---|---|---|---|---|
| 4,528,458 A | * | 7/1985 | Nelson et al. ................. 307/64 |
| 5,283,905 A | * | 2/1994 | Saadeh et al. ............... 395/750 |
| 6,356,057 B1 | * | 3/2002 | Shilo et al. .................. 320/127 |

* cited by examiner

Primary Examiner—Marc S. Hoff
Assistant Examiner—Paul L Kim
(74) Attorney, Agent, or Firm—Tung & Associates

(57) ABSTRACT

A system and method for detecting a malfunction of a slave power supply and triggering an interlock signal in response to the detection of the malfunction. The method for activating an interlock signal on detecting a malfunction of a slave power supply, includes receiving first and second inputs. In one embodiment, the first input received represents status of a set point, and the second input represents output power. On receiving the inputs the method determines that the slave power supply system has malfunctioned when the received inputs substantially mismatch. In response to the determination of the malfunction, an interlock signal is activated. In one embodiment, the system to implement the method includes a processing unit, memory coupled to the processing unit and a program included in the memory, where the program is executable to implement the method.

22 Claims, 9 Drawing Sheets

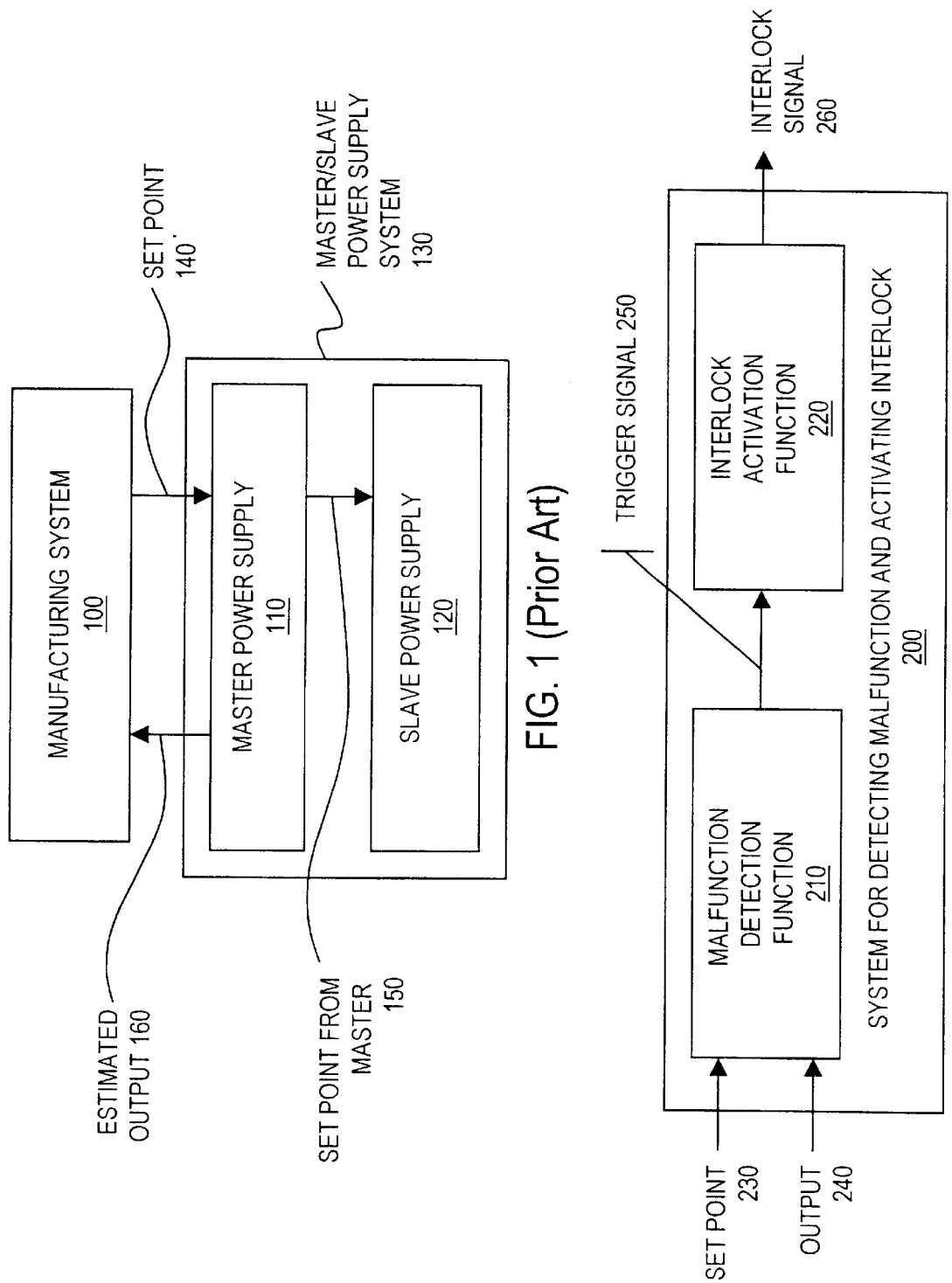

PIN ALLOCATION FOR INTERFACE CONNECTOR 430 BETWEEN DETECTION AND
INTERLOCKCIRCUITING 500 AND MASTER DC POWER SUPPLY 110

| PIN | DESCRIPTION | NOTE |
|---|---|---|
| 1 | D. SETPOINT | STATUS |
| 2 | SOURCE VOLTAGE | READING |
| 3 | SOURCE POWER | READING |
| 4 | OUTPUT ENABLE | |
| 5 | SETPOINT LEVEL | |
| 6 | REMOTE COM | |
| 7 | SUPPLY ON SENSE | |
| 8 | | |
| 9 | OUTPUT ENABLE COM | |
| 10 | REMOTE MAN CONTROL | |
| 11 | SAFETY INTERLOCK | |
| 12 | SAFETY INTERLOCK COM | |
| 13 | D. OUTPUT | STATUS |
| 14 | | |
| 15 | | |

Pins 1-2: SETPOINT STATUS 230
Pin 13: OUTPUT STATUS 240

FIG. 4c

TABLE 490

| CONDITION | SETPNT./EST. OUTPUT | THICKNESS | SETPOINT LED | OUTPUT LED | ALRM. |
|---|---|---|---|---|---|
| 1. NORMAL | 10.3/10.3 | 7.28 | M OK/S OK | M OK/S OK | NO |
| 2. NORMAL | 10.3/10.3 | 7.31 | M OK/S OK | M OK/S OK | NO |
| 3. NORMAL | 10.3/10.3 | 7.31 | M OK/S OK | M OK/S OK | NO |
| 4. NORMAL | 10.3/10.3 | 7.33 | M OK/S OK | M OK/S OK | NO |
| 5. NORMAL | 10.3/10.3 | 7.32 | M OK/S OK | M OK/S OK | NO |
| 6. SLAVE BREAK OFF | 10.3/10.3 | 4.11 | M FAULT S FAULT | M FAULT S FAULT | NO |
| 7. SLAVE BREAK OFF | 10.3/10.3 | 4.13 | M FAULT S FAULT | M FAULT S FAULT | NO |
| 8. SLAVE BREAK OFF | 10.3/10.3 | 4.12 | M FAULT S FAULT | M FAULT S FAULT | NO |
| 9. SLAVE BREAK OFF | 10.3/10.3 | 4.12 | M FAULT S FAULT | M FAULT S FAULT | NO |

LED 450 (TYP.) — LED 470 (TYP.) — LED 480 (TYP.) — LED 460 (TYP.)

FIG. 4d

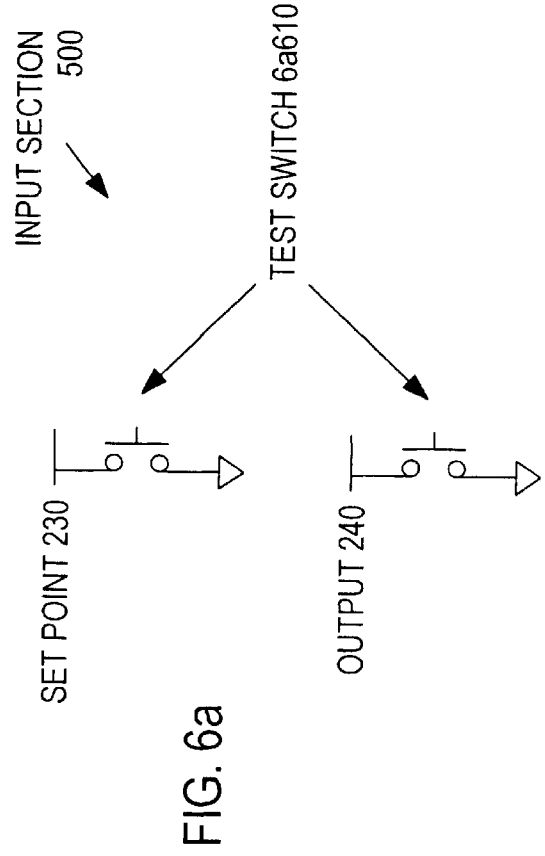
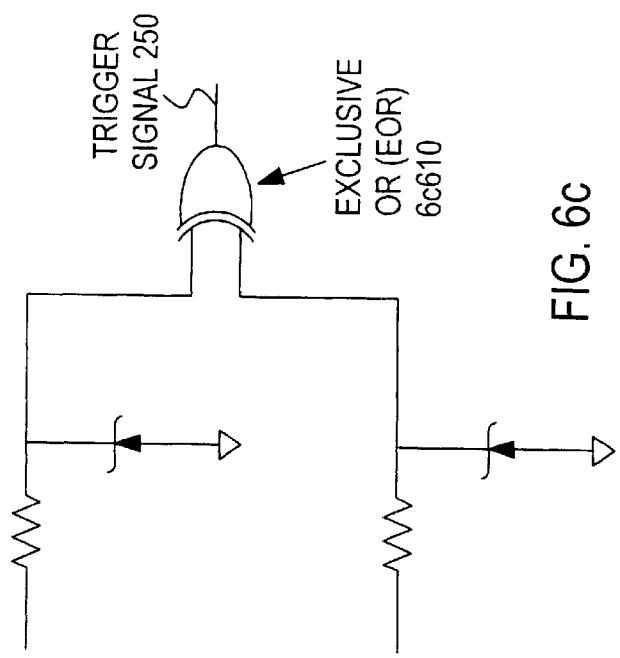
FIG. 6a
FIG. 6b
FIG. 6c

EOR TRUTH TABLE 6d600
| INPUTS A | INPUTS B | OUTPUTS |
|---|---|---|
| L | L | L |
| L | H | H |
| H | L | H |
| H | H | L |
FIG. 6d
DIGITAL SWITCH 530
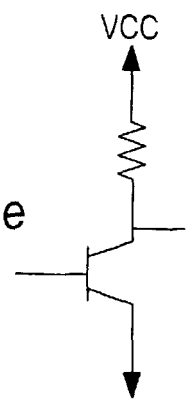
FIG. 6e
TIME DELAY SECTION 540
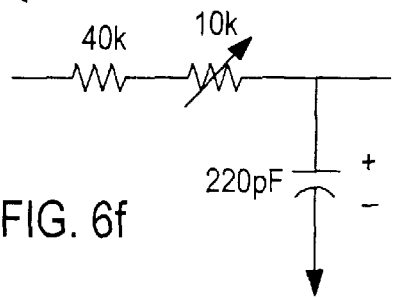
FIG. 6f
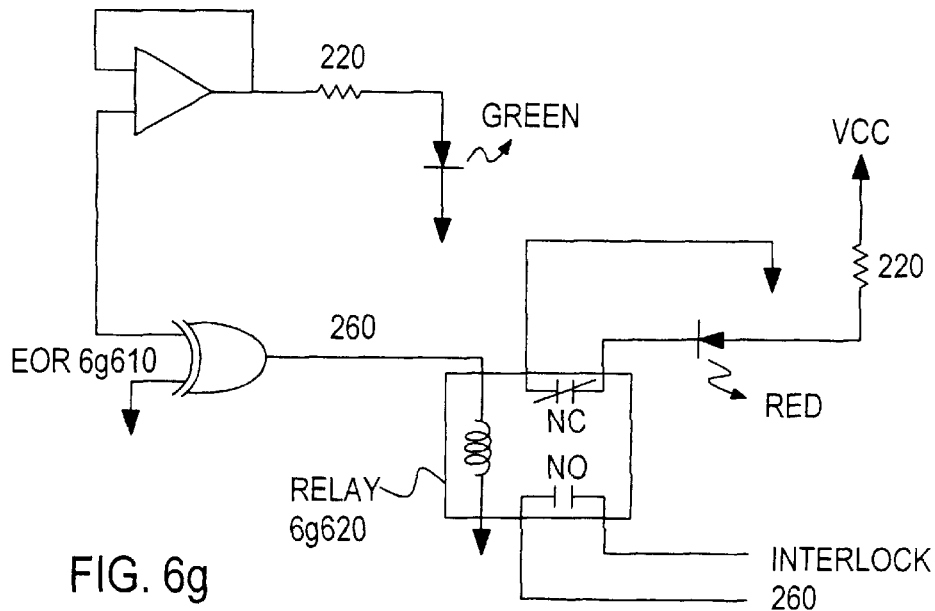
FIG. 6g

SYSTEM AND METHOD FOR DETECTING SLAVE POWER SUPPLY FAILURE

BACKGROUND OF THE INVENTION

1. Field of the Invention

The present invention relates to the field of power supplies, and more particularly to detecting a malfunction of a slave power supply and triggering an interlock signal in response to the detection of the malfunction.

2. Description of the Relevant Art

As defined herein, a "power supply" is a device for the conversion of available power of one set of characteristics to another set of characteristics to meet specified requirements. In a typical application of a power supply, raw input power available in the form of 110V AC or 220V AC is converted to a controlled or stabilized voltage. A power supply system may include a number of power supplies coupled together. Examples of electrical parameters, properties or characteristics which are typically specified for a power supply may include output power, output voltage, output current, input voltage, input current, percent regulation, ripple effect, load impedance, resolution, and accuracy.

As defined herein a "signal" is a detectable and measurable physical quantity or impulse (such as a voltage, current, or power) by which messages or information can be transmitted from a source to a destination. For example, a signal representing a characteristic of a power supply, e.g., voltage, is measured in terms of a value and a measurement unit, e.g., 110 Volts AC. Power supplies play a vital role in the field of semiconductor manufacturing, where a power supply system is required to deliver voltages of up to 1500 volts for sputtering in thin film processing. Predictability, reliability, repeatability and cost are critical in an application such as this, where a malfunction in a power supply may result in the stoppage of a production line. The production loss and the subsequent rework may cost millions of dollars in lost profits. The following U.S. patents, which discuss various applications of power supplies, are hereby incorporated herein by reference: Apparatus for Removal of Electrical Shorts in a Sputtering System (U.S. Pat. No. 5,009,764), Method for Removal of Electrical Shorts in a Sputtering System (U.S. Pat. No. 4,963,238), Method and Apparatus for Recovery from Low Impedance Condition during Cathodic Arc Processes (U.S. Pat. No. 4,963,238), Topographically Precise Thin Film Coating System (U.S. Pat. No. 6,120,656), and Auto-ranging Power Supply (U.S. Pat. No. 6,011,704). The electrical power demand for sputtering in a aluminum chamber may require two power supplies. Referring to FIG. 1, a conventional arrangement of two power supplies as a master/slave power supply system 130 is illustrated. The power supply system 130 serves a manufacturing system 100. One example of such a manufacturing system is the Endura® PVD (physical vapor deposition) system manufactured by Applied Materials, Inc., Santa Clara, Calif. One example of a power supply system is the MDX Series power supply, manufactured by Advanced Energy Industries, Inc., Fort Collins, Colo.

In FIG. 1, the load on the power supply system 130 is shared by a first power supply 110 and a second power supply 120 in a "master/slave" arrangement, that is, an arrangement in which the first power supply 110 controls the proportion of the load supplied by each one of the respective power supplies 110 and 120. This arrangement may be configurable. For example, the master and the slave power supplies may be configured so that the master power supply 110 splits the load substantially equally with the slave supply 120.

The master-slave power supply system 130 of FIG. 1 is configured in a cascade arrangement, according to which the manufacturing system 100 sends a set point signal 140 to the master power supply 110 to represent an output power demand. This required power is variable since as the manufacturing process requirements change the need for power required by the manufacturing system may vary. For example, if the system 100 detects an impurity in the aluminum chamber the system will demand more power.

The master power supply 110 receives the set point 140 from the manufacturing system 100 and in response regulates its output and/or the set point 150 for the slave power supply 120 output. The slave power supply 120 receives the set point 150 and in response regulates its own output.

In response to the set point 140 received from the manufacturing system 100, the master power supply 110 also sends to the manufacturing system 100 a signal 160 which is an estimate of the combined master-slave power supply output. In the system 130 of FIG. 1, the master power supply 110 always assumes that the slave power supply 120 is able to match the actual power output to the set point 140 received from the master. However, the slave power supply 120 might not be able to deliver the desired power output as specified by the set point 150. This could be due to lack of capacity, for example, or due to some other malfunction. Since, as is illustrated in FIG. 1, there is, at least in some respects, an absence of feedback to the master power supply 110 from the slave 120 to indicate whether the slave power supply 120 has been able to adjust its output to match the set point 150, a malfunction of a slave power supply 120 may not be known to the master. Thus, a need exists to detect a malfunction of a slave power supply 120 and trigger an interlock signal in response to the malfunction. Furthermore, this need is harder to address by a user of a power supply system 130 than it would be by the power supply developer. That is, when an existing power supply system must be retrofitted for detection of the slave power supply malfunction and triggering of an interlock there are more constraints than there would be if detection and interlocking were being designed for a power supply system during development of the system.

SUMMARY OF THE INVENTION

The problems outlined above are addressed by a system and method for detecting a malfunction of a slave power supply and triggering an interlock signal in response to the detection of the malfunction, as described herein.

Power supplies may be regulated in a variety of ways. In an embodiment of the present invention, a feedback technique is used, according to which a feedback signal provides information about voltage output to control circuitry of the power supply system. A set point signal establishes a target output level that the control circuitry attempts to maintain. The set point may be established through a manual setting or by a software program, for example. The control circuitry regulates the power supply by comparing the set point to the actual voltage output. A "malfunction" of the system occurs when the system fails to operate normally. If the control circuitry is not able to regulate the power supply output voltage, for example, this is abnormal and is thus a malfunction of the power supply.

In one embodiment, a master-slave power supply is configured in a cascade arrangement to supply power to a manufacturing system. A manufacturing system responds to the conditions of the manufacturing process by adjusting a set point for demanding a specified output power from the master-slave power supply. In response to receiving the set point from the manufacturing system the master power supply demands an output from the slave power supply such that the combined output power meets the specified output power.

In a first form, a method for activating an interlock signal upon detecting a malfunction of a slave power supply includes receiving a first input from the slave power supply representing the set point for the output power of the slave power supply, and a second input from the slave power supply representing the output power of the slave power supply. According to the method, a determination is made that the slave power supply system has malfunctioned if the received inputs substantially mismatch. In response to the determination of the malfunction, an interlock signal is activated.

In one aspect, the input received for the set point may represent the status of a set point LED on the master power supply. In another aspect, the input received for the output may represent the status of an output LED on the master power supply.

In another form, a system for detecting malfunction of a power supply and activating an interlock includes component based electronic circuits for the detecting and interlocking, according to an embodiment. In one aspect, the system includes a first circuit section and a second circuit section.

In one embodiment, the first circuit section provides the function of malfunction detection and includes an input section, a noise isolation section and a logic control section. The first circuit section is configurable to receive a signal representing the set point for the output power and a signal representing the output power of the slave power supply system. The first circuit section is configurable to activate a trigger signal when the set point signal is not substantially equal to the output signal.

The second circuit section, which is electrically coupled to the first circuit section, is configurable to activate the interlock signal in response to receiving the trigger signal. In one embodiment, the second circuit section provides the function of interlock activation and includes a digital switch section, a time delay section and a interlock trigger section.

In another embodiment, a processor executes program instructions stored in memory to implement at least some aspects of the system or method. According to this embodiment, the system includes a processing unit, memory coupled to the processing unit and a program included in the memory. The program is executable by the processor to implement malfunction detection and interlock triggering logical functions.

BRIEF DESCRIPTION OF THE DRAWINGS

Novel features believed characteristic of the invention are set forth in the appended claims. The invention itself, however, as well as a preferred mode of use, various objectives and advantages thereof, will best be understood by reference to the following detailed description of an illustrative embodiment when read in conjunction with the accompanying drawings, wherein:

FIG. 1, described herein above, is a block diagram illustrating a prior art master-slave power supply system for a manufacturing system;

FIG. 2 is a block diagram illustrating a system for detecting a malfunction of a slave power supply and triggering an interlock signal in response to the detection of the malfunction, according to an embodiment of the present invention;

FIGS. 4a–4d illustrate aspects of discoveries resulting from analysis of and experimentation with an existing power supply system 130;

FIGS. 6a–6g are schematic diagrams illustrating various aspects of electronic circuitry for the functional blocks of FIG. 5, according to an embodiment;

DETAILED DESCRIPTION OF AN EMBODIMENT

Figure 3:
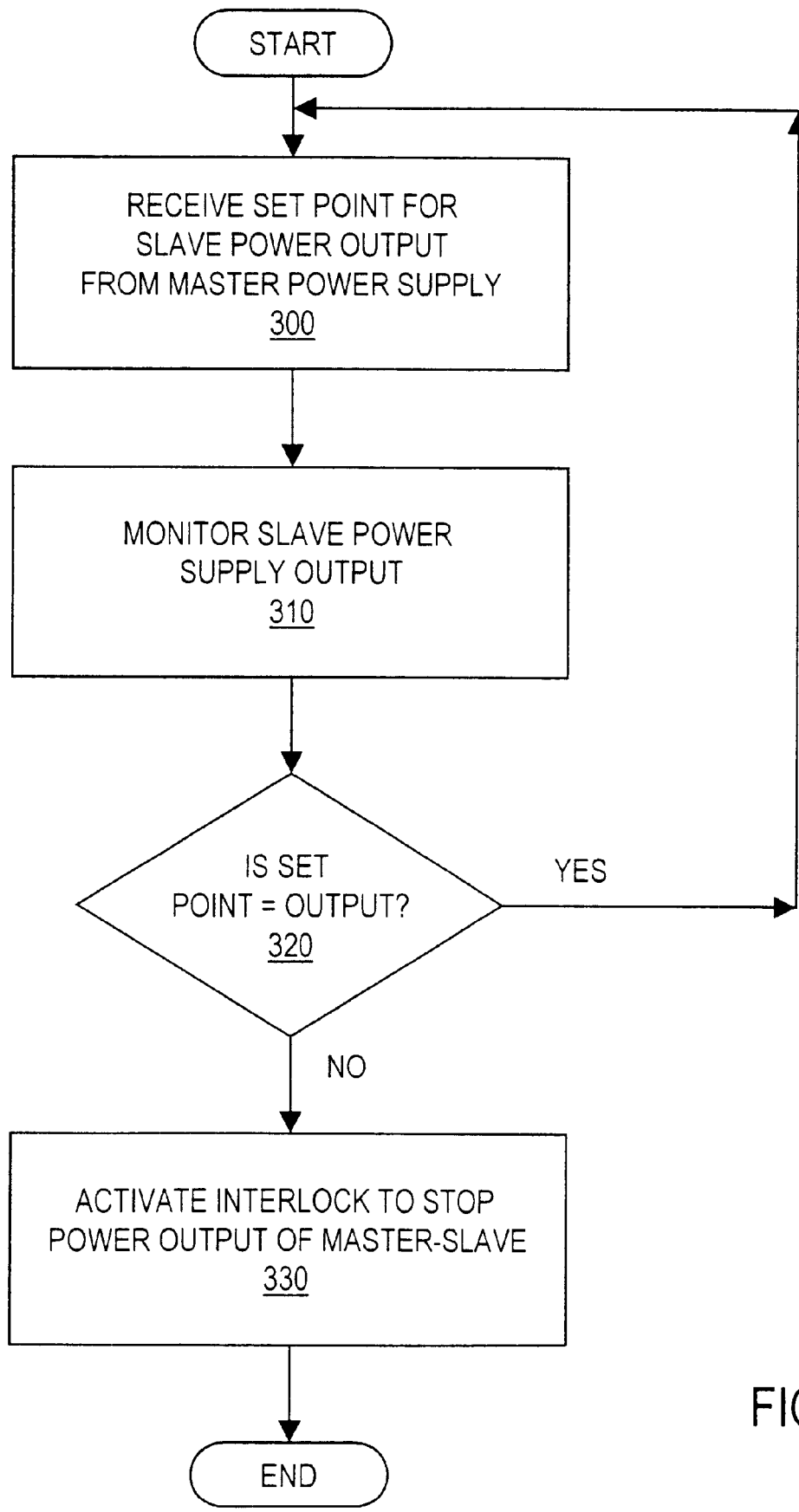
FIG. 3 is a flow chart illustrating a method for detecting a malfunction of a slave power supply and triggering an interlock signal in response to the detection of the malfunction, according to an embodiment of the present invention.

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Elements which appear in more than one FIG. herein are numbered alike in the various FIGS.

FIGS. 4a, 4b, 4c and 4d illustrate aspects of discoveries resulting from analysis of and experimentation with an existing power supply system 130.

For the present invention there was a need to retrofit an existing power supply system 130 for detecting a malfunction of the slave power supply, and for triggering of an interlock. As stated herein above, there are more constraints in this situation than there would be if the power supply system was under development. For example, for an extant power supply system only certain signals are conveniently accessible to the user. Furthermore, since user documentation of the system is not directed at the detection and interlock problem, it is difficult for a user to determine what accessible signals and control points exist in the system and what is their function and interrelationship.

To address these difficulties, an existing system was analyzed and experiments were conducted. One objective was to establish whether a malfunction of a slave power supply triggered a fault alarm in the system. Other objectives were to determine what accessible signals existed in the system that could serve as suitable inputs for retrofit detection circuitry, and what control points existed that could be manipulated by retrofit interlock circuitry.

Figure 4A:
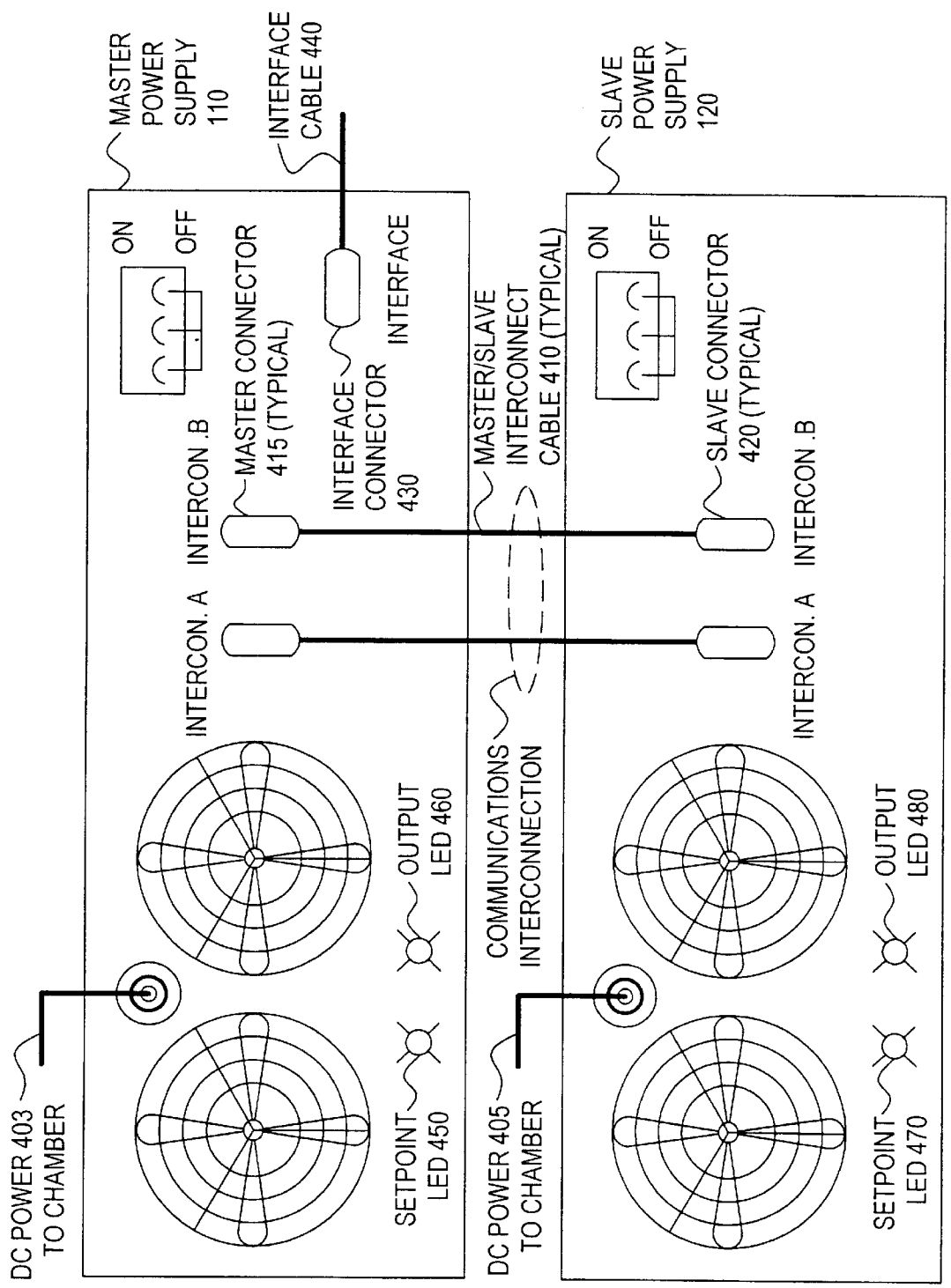

The power supply system 130 which was studied is illustrated in FIG. 4a. In this system 130, two power supplies 110 and 120 are electrically coupled together in a master-slave arrangement. The master-slave combination is configured in a cascade arrangement. The power output 403 generated by the master power supply is combined with the power output 405 of the slave power supply and the combined power output of the master-slave configuration is transferred to the manufacturing system 100, e.g., the Endura® 100 PVD system.

Information is communicated between the two power supplies 110 and 120 by electrical coupling therebetween using a pair of cables 410, each with a 15-pin connector 415 at the master end and a 15-pin connector 420 at the slave end. That is, the cables 410 transfer electrical signals representing information such as voltage, current and power between the master power supply and the slave power supply. Similarly, information is communicated, via interface cable 440 and connector 430, between the power supply 110 and certain detection and interlock circuitry 500 of an embodiment of the present invention, as described herein below in connection with FIGS. 5 and 6a through 6h.

A set point LED 450 and output LED 460 on the master power supply 110, and a set point LED 470 and output LED 480 on the slave power supply 120 provide status information, as will be described further herein below. (It should be understood that the layout of FIG. 4a is merely for illustration and does not necessarily represent a literal physical arrangement. For example, the LED's 450–480 may not necessarily be located as shown.)

Figure 4B:
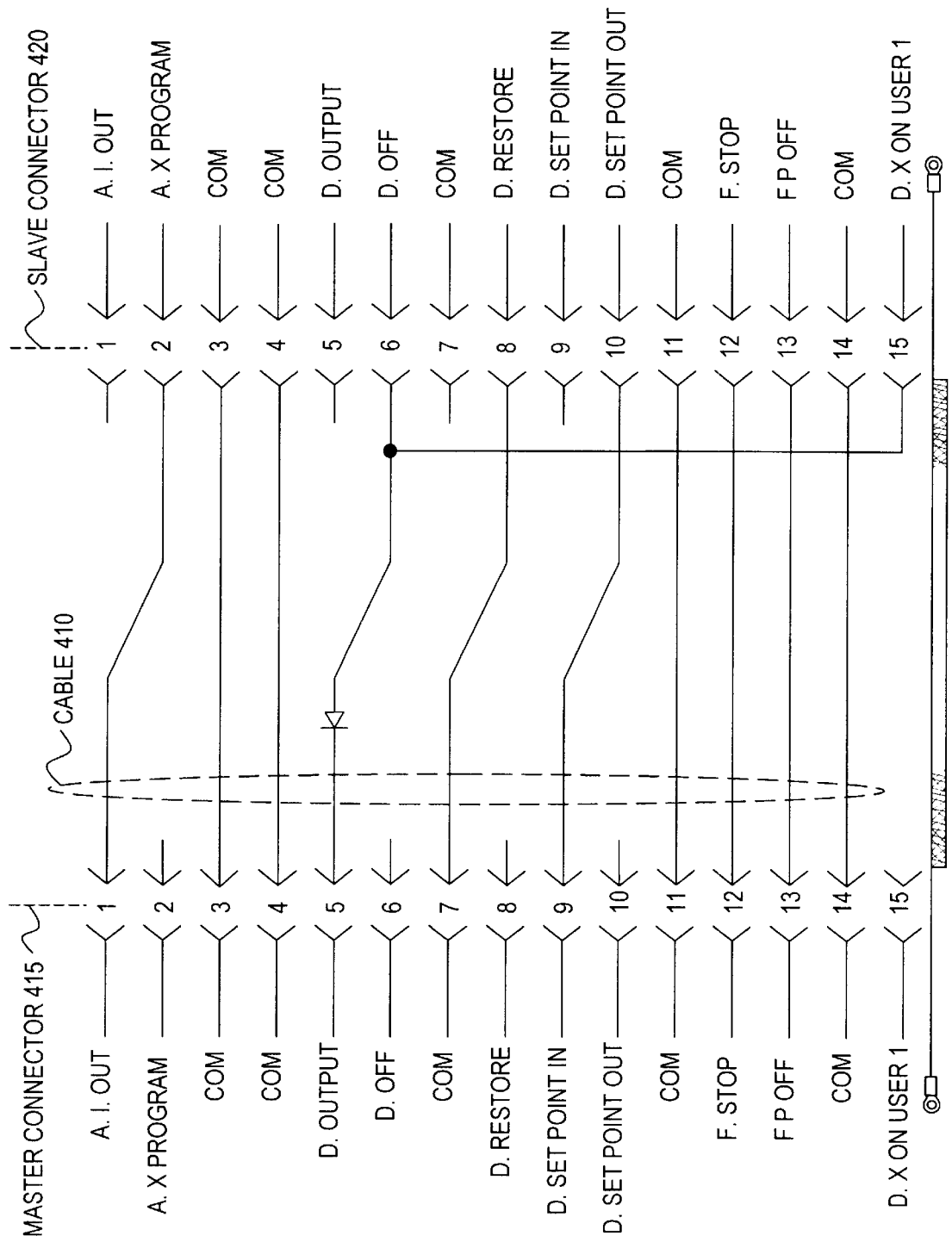

FIG. 4b shows pin-by-pin interconnect wiring for the master-slave power supply interconnection cables 410 and connectors 415/420.

FIG. 4c, illustrates signals on the interface cable 440 and 15-pin connector 430. Pin 1 represents the status of the voltage set point, pin 2 represents a voltage output signal, pin 3 represents a power output signal, pin 4 represents a signal to enable power supply output, pin 5 represents the set point level, pin 6 represents a channel for remote communication, pin 7 represents a signal to sense power supply on, pin 9 represents a communication channel to enable output, pin 10 represents a channel to manually control from a remote location, pin 11 carries a safety interlock signal, pin 12 represents a communication channel for the safety interlock signal, and pin 13 represents the status of the voltage output.

The experiment included observing values, shown in FIG. 4d, of various electrical parameters, properties or characteristics associated with the slave power supply 120 and the potential effect of the power supply system 130 performance on the manufacturing system 100 (FIG. 1). The observed parameters included a value, shown in column 1 of Table 490 for the set point 140 (FIG. 1), a value, also shown in column 1, of the estimated output power supplied to the manufacturing system 100, status indications 450 and 470 for set points, column 4, and status indications 460 and 480 for power outputs, column 5, for the respective master 110 and slave 120 power supplies. Along with each set point to the master-slave power supply 130 and the estimated output power supplied to the manufacturing system 100, a corresponding measurement that represents the thickness of a thin film being manufactured by using a manufacturing system, e.g., the Endura® 100 PVD system, is also set out, column 3.

As illustrated in FIG. 4d, nine observations were recorded for the various values described above. The observations included values recorded under normal operating conditions of the slave power supply as well as when the slave power supply malfunctioned. The experimentation results established that malfunctioning of the slave power supply directly resulted in a substantial deviation in the expected thickness of a thin film being manufactured by using the manufacturing system, e.g., the Endura® 100 PVD system. However, the malfunctioning of the slave did not trigger any alarm indication, nor substantially affect the values of the set point 140 (FIG. 1) from the manufacturing system 100 or the value for the estimated output power 160 (FIG. 1) to the manufacturing system 100 from the power supply system 130. This confirmed the need for malfunction detection and interlocking.

During the experimentation it was observed that the set point LED 450, representing status of the set point 140 (FIG. 1) from the manufacturing system 100 (FIG. 1) on the master power supply 110 did not light up when the slave power supply 120 malfunctioned. More particularly, a malfunction of the slave power supply 120 is indicated by the master power supply 110 set point LED 450 being off (i.e., "fault," i.e., disabled), provided that at the same time a master power supply 110 output LED 460 is on i.e., "Ok," i.e., enabled). The set point LED 450 status corresponds to presence or absence of a voltage exceeding a certain threshold level on pin 1 ("set point status 230" FIG. 4c) of connector 430 (FIG. 4a). The output LED 460 status corresponds to presence or absence of voltage exceeding a certain threshold level on pin 13 ("output status 240" FIG. 4c) of connector 430. Thus in one embodiment, a malfunctioning status for the set point input 230 may be represented by a disabled status of the set point LED 450 on the master power supply 110, detectable by the voltage level on pin 1 of connector 430, in the presence of an enabled status of the output LED 460 on the supply 110, detectable by the voltage level on pin 13 of the connector 430.

FIG. 2—A block diagram illustrating a system for detecting a malfunction of a slave power supply and triggering an interlock signal in response to the detection of the malfunction One embodiment of a system 200 for detecting a malfunction of a slave power supply and triggering an interlock signal in response to the detection of the malfunction is illustrated in FIG. 2. The system is configurable to receive inputs from the master-slave power supply 130 system. The inputs typically represent the electrical parameters, properties or characteristics, which may be specified for the slave power supply 120. It is desirable to select the type of inputs such that the comparison of their values conclusively establishes the function or malfunction of the slave power supply 120. In one embodiment a first input signal represents set point status 230 for the master power supply 110, and a second input signal represents output status 240 for the master power supply 110. In various embodiments, the set point signal 140 (FIG. 1) specifies a desired power, voltage or current output for system 130 (FIG. 1), and set point status 230 correspondingly indicates status of this signal 140. Likewise, the estimated output signal 160 (FIG. 1) may specify estimated power, voltage or current, and output status 240 correspondingly indicates status of this signal 160.

In one embodiment, a plurality of inputs may be received. The plurality of inputs may include one or more pairs of set point 230 and output 240 signals. For example, one input pair may represent, a set point and output signal for output voltage, and a second input pair may represent a set point and output signal for output current. In a regulated power supply that is operating under normal conditions, the output of the power supply substantially matches the set point input to the power supply. A mismatch between the value of a set point 230 signal and the value of an output 240 signal is declared as a power supply malfunction.

The malfunction detection function 210 receives the set point 230 and the output 240 signals as inputs. In one embodiment, the malfunction detection function compares the two inputs received and determines if the two inputs substantially match each other. A substantial mismatch is determined to be a malfunction of the slave power supply 120. In response to detecting a malfunction of the slave power supply 120, the malfunction detection function 210 generates a trigger signal 250. In one embodiment, a first circuit section implements the malfunction detection function 210. In one embodiment, a processor executes program instructions stored in memory to implement the malfunction detection function 210.

The interlock activation function 220 is configured to receive the trigger signal 250. In response to receiving the trigger signal, the interlock activation function 220 is configured to activate or generate an interlock signal 260. Thus, the activation of the interlock signal 260 is directly tied to the occurrence of a malfunction in the slave power supply and the subsequent detection of the malfunction by the malfunction detection function 210. In one embodiment, a second circuit section implements the interlock activation function 220. In one embodiment, a processor executes program instructions stored in memory to implement the interlock activation function 220.

The interlock signal 260 may be transferred to the master power supply or other systems electronically coupled to the master-slave power supply 130 to stop the flow of power to the manufacturing system 100.

FIG. 3—A flow chart illustrating a method for detecting a malfunction of a slave power supply and triggering an interlock signal in response to the detection of the malfunction. FIG. 3 is one embodiment of a flow chart illustrating a method for detecting a malfunction of a slave power supply and triggering an interlock signal in response to the detection of the malfunction.

In step 300, an input representing the set point is received from the master power supply 110. In one embodiment, the set point is representative of the output power required by the master power supply 110. In one embodiment, the master power supply computes the difference between the power output required by the manufacturing system 100, e.g., the Endura® 100 PVD system, and the rated power output of the master power supply 110. The difference is transferred to the slave power supply 120 as the set point for the power output. In one embodiment, the master power supply divides the power output required by the manufacturing system substantially equally between the master and the slave power supplies. A value equal to half of the power output required by the manufacturing system is transferred as a set point to the slave power supply 120.

The regulated slave power supply 120 will deliver the output power to substantially match the set point under normal operating conditions. In step 310, the output power of the slave power supply is monitored and measured. In step 320, a determination is made if the set point received substantially matches the output power of the slave power supply. If it is determined that the set point received substantially matches the output power of the slave power supply 120, which would be expected under normal operating conditions, then program control is transferred to step 300.

If it is determined that the set point received does not substantially match the output power of the slave power supply 120, which would be expected when there is a slave power supply malfunction, then program control is transferred to step 330. Arrival at step 330 only occurs when the slave power supply 120 has a malfunction. In step 330, an interlock signal may be activated in response to the detected malfunction in the slave power supply.

Various steps of FIG. 3 may be added, omitted, combined, altered, or performed in different orders. For example, in one embodiment, steps 300 and 310 are combined into one step, where the value for a set point for the slave power output and the monitored value of the power output are operable as a parallel process and the values are received concurrently.

As described above, the method illustrated in FIG. 3 may be implemented by using a system which includes component based electronic circuits or by using a system which includes a processor enabled to execute program instructions, where the program instructions are stored in memory electronically coupled to the processor.

Figure 5:
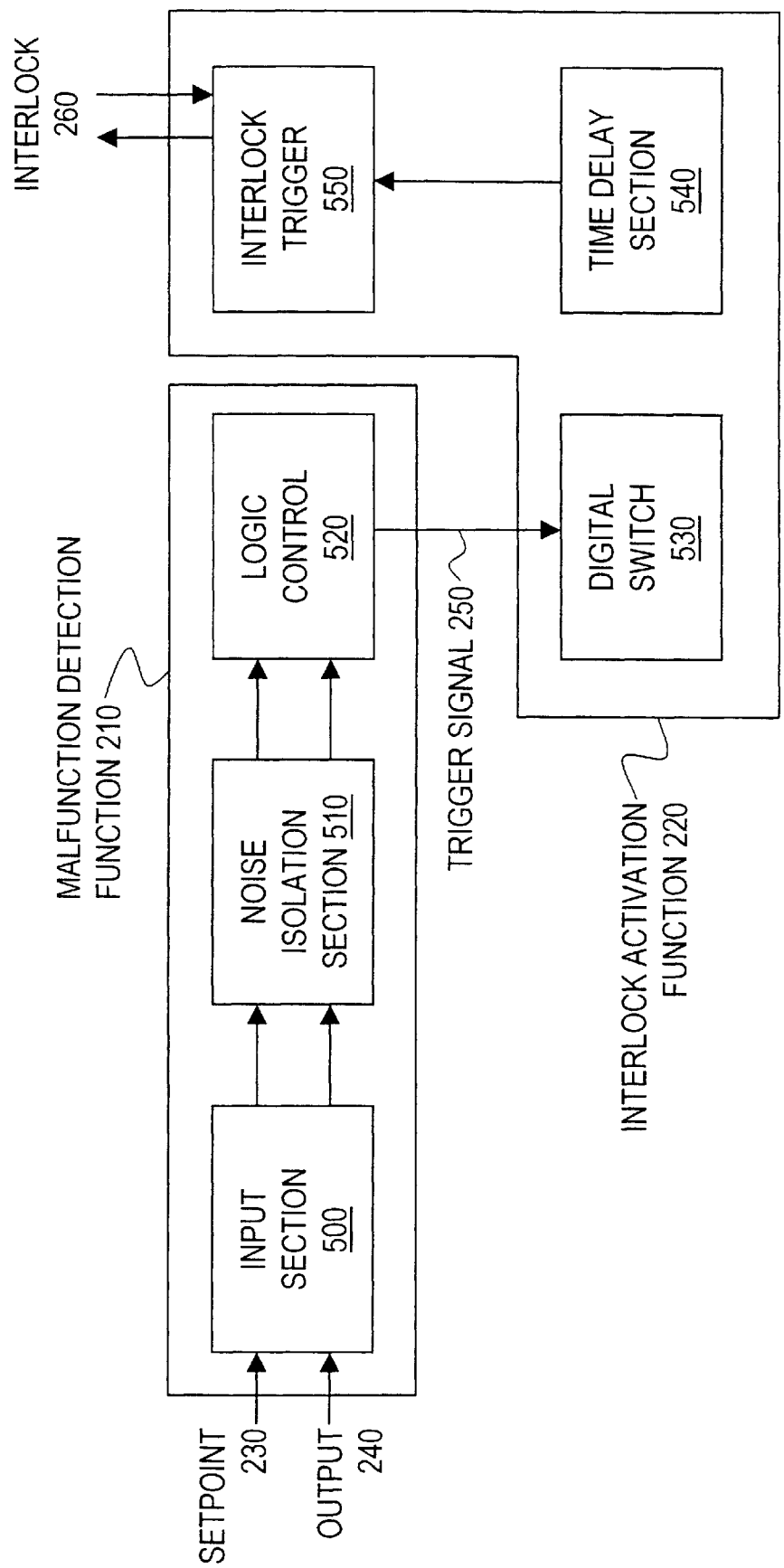
FIG. 5 is a functional block diagram for the system of FIG. 2, according to an embodiment.

FIG. 5—A functional block diagram illustrating the malfunction detection function and the interlock activation function in further detail As described earlier in FIG. 2, the system 200 for detecting a malfunction of a slave power supply and triggering an interlock signal in response to the detection of the malfunction includes the malfunction detection function 210 and the interlock activation function 220. FIG. 5 illustrates one embodiment of a functional block diagram for the system 200 in further detail.

Referring to FIG. 5, in one embodiment, the malfunction detection function 210 includes the input section 500, the noise isolation section 510 and the logic control section 520. The input section 500 is configurable to receive the set point 230 signal and the output 240 signal as inputs. The input section 500 prepares the inputs for further processing, e.g., by adjusting the proper signal voltage level. It may be desirable to provide a normally open switch to act as a testing point for each of the inputs. The one or more outputs of the input section 500 are transferred as one or more inputs to the noise isolation section 510.

The noise isolation section 510 typically provides isolation for each of the input signals from the background noise. The logic control section 520 generates the trigger signal 250 in response to receiving the one or more outputs of the noise isolation section 510. The logic control section 520 typically provides logic and control functionality to determine whether a malfunction of the slave power supply has occurred. In one embodiment, a truth table function is specified in order to determine one or more outputs based on a given set of inputs.

In one embodiment, the interlock activation function 220 includes the digital switch section 530, the time delay section 540 and the interlock trigger section 550. The trigger signal generated by the logic control section 520 is configured as an input to the digital switch section 530. In one embodiment, the trigger signal 250 may not have sufficient signal characteristics to directly trigger the interlock signal 260.

The digital switch section 530 is configured to provide an on/off digital switch with sufficient signal characteristics to trigger the interlock signal 260. The time delay section 540 is configured to receive the input from the digital switch section 530 and in response generate an output signal. That is, the time delay section 540 effectively receives the trigger signal via the switch section 530, and has an output representing the trigger signal coupled to the interlock trigger section 550. The time delay section 540 outputs its signal to the interlock trigger section 550 responsive to persistence for a certain time interval of the trigger signal that is input to the time delay section 540. The time delay section 540 is typically included in the design to allow for time delays associated with the manufacturing process. For example, the plasma in the PVD may not ramp up initially as instructed. A second ramp up request may be required, thereby introducing an ignition time delay. The time delay section 540 includes a configurable time constant to accommodate variable manufacturing process time constants.

The trigger interlock section 550 is configured to receive the output of the time delay section 540 and, in response, generates the interlock signal 260. The trigger interlock section 550 prepares the interlock signal 260 for further processing, e.g., by adjusting the proper signal voltage level of the time delayed output.

In one embodiment, the interlock signal 260 is used to shut off the master-slave power supply 130 power output. In one embodiment, the interlock signal is directly passed on to the manufacturing system 100, e.g., the Endura® 100 PVD system, for further processing. In one embodiment, the system 200 is configurable to receive a response from the manufacturing system 100, e.g., the Endura® 100 PVD system, acknowledging the receipt of the interlock signal 260.

In one embodiment, each of the sections illustrated in FIG. 5, i.e., sections 500, 510, 520, 530, 540, and 550, may be implemented by using a variety of technologies such as single function chips electrically coupled to from a circuit, multifunction integrated circuits and microprocessors. In one embodiment, the implementation strategy uses component based electronic circuits to implement the malfunction detection function 210 and/or the interlock activation function 220. In one embodiment, a processor executes program instructions stored in memory to implement the system 200.

FIGS. 6a, 6b, 6c, 6d, 6e, 6f and 6g—Exemplary schematic diagrams of an electronic circuit to implement system for detecting a malfunction of a slave power supply and triggering an interlock signal in response to the detection of the malfunction.

As discussed above, the system and method described herein may be implemented by using component based electronic circuits. FIGS. 6a through 6g illustrate one embodiment of an exemplary schematic diagram to implement the system 200 for detecting a malfunction of a slave power supply and triggering an interlock signal in response to the detection of the malfunction. Specifically, FIGS. 6a, 6b, 6c, 6d, 6e, 6f, 6g and 6h, illustrates one embodiment of an exemplary schematic diagram to implement, respectively, the input section 500, noise isolation section 510, logic control section 520, digital switch section 530, time delay section 540 the interlock trigger section 550 shown in FIG. 5. Accordingly, FIGS. 6a, 6b, etc. are electrically interconnected as shown in the corresponding sections 500, 510, etc. of FIG. 5.

Referring to FIG. 6a illustrating one embodiment of a schematic diagram to implement the input section 500, the on or off status of the set point LED on the master power supply available on pin 1 of the male connector of the interface cable is used to represent the set point 230 input. In one embodiment, the on or off status of the output LED on the master power supply available on pin 13 of the male connector of the interface cable is used to represent the output 240 as the second input.

In one embodiment, it is desirable to be able to test each of the set point 230 and the output 240 inputs to verify and/or simulate the proper operation of the system 200. A normally open test switch 6a610 is included in a bypass path to ground from each of the inputs. On closing the normally open switch, the input is forced to a logic low, e.g., the ground level voltage. The set point 230 and the output 240 inputs are considered to at logic high when they are floating without the inputs being connected to any source.

Referring to FIG. 6b, in one embodiment, the implementation of the noise isolation section 510 includes an Operational Amplifier (OP) 6b610 Follower circuit for each of the set point 230 and the output 240 inputs. The OP Follower prevents the background noise from interfering with the inputs.

Referring to FIG. 6c, in one embodiment, the implementation of the logic control section 520 includes an Exclusive OR (EOR) 6c610 gate. The logic control section 520 is configurable to determine the logic state of one or more outputs based on the logic state of one or more inputs. A truth table 6d600 for the EOR circuit, illustrated in FIG. 6d, specifies that when the signals for the set point 230 and the output 240 inputs substantially match, i.e., both are at a logic high state or a logic low state, then the output of the EOR gate is determined to at a logic low state. However, in the event the EOR receives signals for the set point 230 and the output 240 inputs, which substantially mismatch, i.e., one input is at a logic low state and the other input is at a logic high state, then the output of the EOR gate is determined to at a logic high state.

In one embodiment, a resistor is included in series on each of the set point 230 and the output 240 inputs to limit the current and thereby offer protection to the system 200 from accidental short circuits to the inputs. In one embodiment, a Zener diode is included to stabilize the logic high level to the EOR circuit. When either of the input signals is at a logic high state the Zener diode maintains the specified voltage level, e.g., at 5.1 volts for that input. When either of the input signals is at a logic low state then the Zener diode maintains a ground level for that input. The logic control section 520 is thus be protected from working under or over the logic high or logic low levels.

Referring to FIG. 6e in one embodiment, the implementation of the digital switch section 530 includes a bipolar junction transistor (BJT) circuit configured in a common-emitter (CE) mode. In the common-emitter mode configuration, the emitter terminal is common to both the input and output signal. In the saturation mode of operation of the BJT circuit, the $V_{CE}$ is substantially close to the ground potential, e.g., 0.3 volts. In the cutoff mode of operation of the BJT circuit, the two PN junctions work in reverse bias. In the cutoff mode, the $V_{CE}$ is substantially close to $V_{CC}$ voltage, e.g., 5 volts. The BJT transistor works like an on/off switch.

Referring to FIG. 6f in one embodiment, the implementation of the time delay section 540 includes a resistor capacitor (RC) circuit. In one embodiment, the time delay introduced by the RC circuit is configurable. In one embodiment, the time delay introduced by the RC circuit is adjustable by adjusting the value of a variable resistor included in the RC circuit. As described earlier, the time delay introduced by the RC circuit may be sufficient to allow for the ignition delay potentially introduced during the ramp up operation. In one embodiment, the time delay is adjustable from a minimum value substantially close to 1 second to a maximum value which is substantially close to 20 seconds. A typical value for the adjustable time delay is configured to be 9 seconds.

Referring to FIG. 6g in one embodiment, the implementation of the interlock trigger section 540 includes an Exclusive OR 6g610 gate, an operational amplifier, a green LED, a red LED and a relay 6g620 electrically coupled as illustrated in the schematic diagram of the circuit. In one embodiment, under normal operating condition of the system 200 the trigger signal 250 is disabled. The output of the interlock trigger section 540, e.g., interlock signal 260, is be disabled. The green LED included in the interlock trigger section 540 is enabled to indicate normal operation of the slave power supply.

In one embodiment, the activation of the input signal to the interlock trigger section 540 due to a malfunction of the slave power supply results in enabling the output of the EOR gate thereby activating the relay 6g620 circuit. The red LED and the interlock signal 260 included in the interlock trigger section 540 are enabled to indicate a malfunction of the slave power supply. In one embodiment, the interlock signal 260 is powered from a 24 VDC source.

Figure 7:
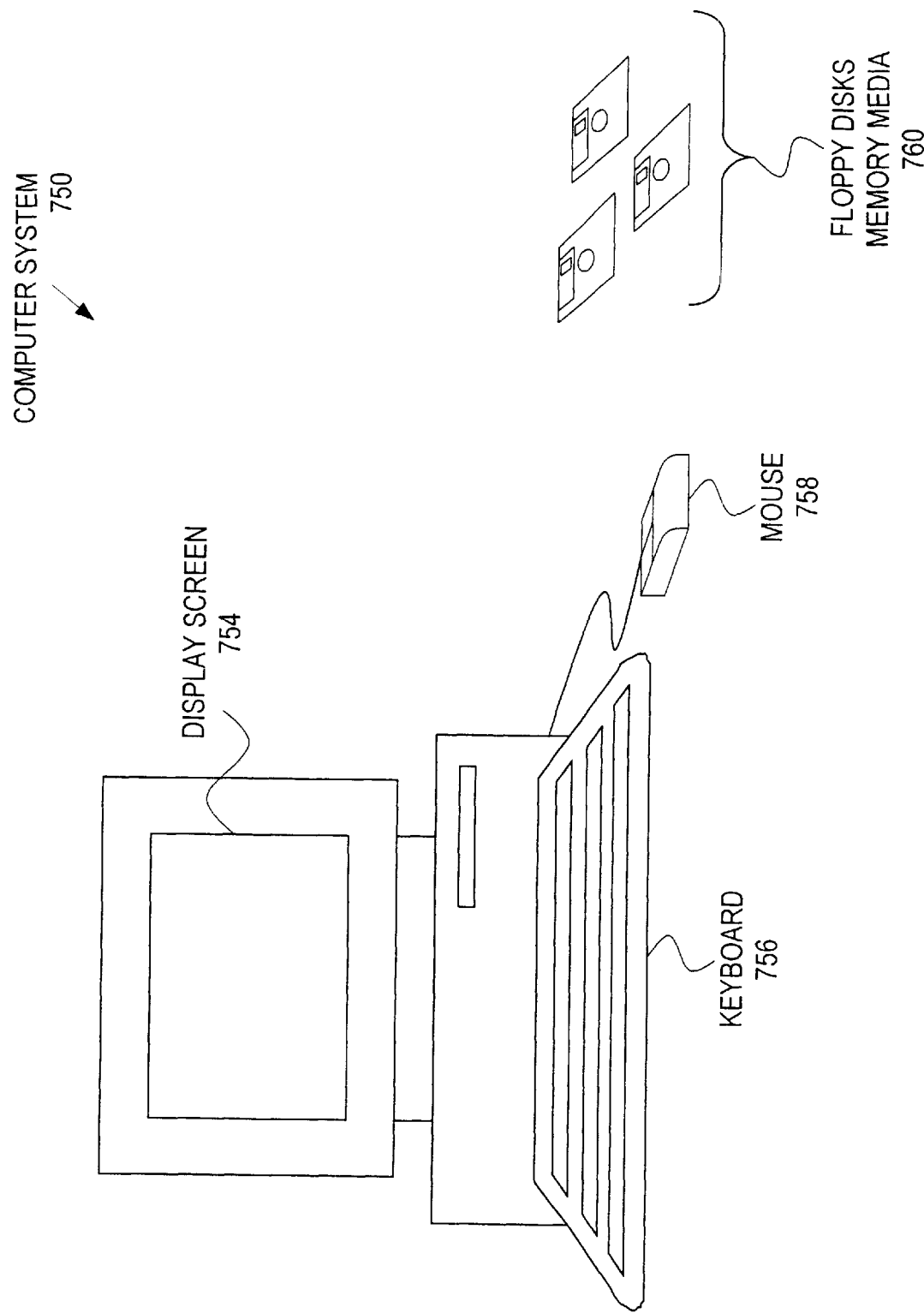
FIG. 7 illustrates an exemplary computer system to implement method or apparatus aspects of the present invention.

FIG. 7—Exemplary computer system to implement method for detecting a malfunction of a slave power supply and triggering an interlock signal in response to the detection of the malfunction.

Referring to FIG. 7, a computer system 750 is shown which is useable to implement the method for detecting a malfunction of a slave power supply and triggering an interlock signal in response to the detection of the malfunction according to the present invention. The computer system 750 includes various standard components, including a display screen 754, a user input device, such as a mouse 758 or keyboard 756, memory (not shown), processor (not shown), DVD/CD-ROM (not shown), and a floppy disk drive (not shown). As used herein, the term "processor" generally describes the logic circuitry that responds to and processes the basic instructions that operate a computer system. The present invention preferably comprises a method executed by the computer system to detect a malfunction of a slave power supply and trigger an interlock signal in response to the detection of the malfunction. The present invention also includes a memory media, included in the computer system, which stores software or program instructions which are executable by the computer to implement the above method. The memory media may be any of various types, including system memory, such as DRAM, SRAM, EDO RAM, RAMBUS RAM, etc., nonvolatile memory such as a hard disk or optical storage, and installation media such as a CD-ROM, DVD or floppy disks 760. The memory medium may include other types of memory as well, or combinations thereof. The term "computer system" as used herein generally describes the hardware and software components that in combination allow the execution of computer programs. Computer programs may be implemented in software, hardware, or a combination of software and hardware. In one embodiment, one or more computer programs are configured for the malfunction detection function 210. Other computer programs for implementing the input section 500, the noise isolation section 510 and the logic control section 520 may also be included. In one embodiment, one or more computer programs are configured for the interlock activation function 220. Other computer programs for implementing the digital switch section 530, the time delay section 540 and the interlock trigger section 550 may also be included.

The computer system 750 may take various forms, including a personal computer system, mainframe computer system, workstation, Internet appliance, personal digital assistant (PDA), an embedded processor with memory or other similar device. In general, the term "computer system" may be broadly defined to encompass any device having a processor, which executes instructions from a memory medium.

The memory medium preferably stores software programs for detecting a malfunction of a slave power supply and triggering an interlock signal in response to the detection of the malfunction as described herein. The software program(s) are implemented in any of various ways, including procedure-based techniques, component-based techniques, and/or object-oriented techniques, among others. For example, the software program are typically implemented using XML, C++ objects, Java, Microsoft Foundation Classes (MFC), or other technologies or methodologies, as desired. A processor, such as the host CPU, executing code and data from the memory medium includes a means for creating and executing the software program or programs according to the methods and/or block diagrams described earlier.

The software of a computer system (e.g., computer system 750) typically includes at least one operating system. The operating system is typically available commercially or may be of a proprietary design. The operating system is a specialized software program that manages and provides services to other software programs on the computer system. Software may also include one or more programs to perform various tasks on the computer system and various forms of data to be used by the operating system or other programs on the computer system. A program is often copied into a volatile memory when running on the computer system 750. Data is read into volatile memory as required by a program.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for activating an interlock signal for a power supply system, the method comprising:

receiving inputs representing one or more electrical properties of the power supply system, wherein a master power supply is configurable to receive a first set point and to indicate an estimated output for the power supply system, and a first one of the inputs represents status of the first set point and a second one of the inputs represents status of the estimated output indication;

determining that the slave power supply has malfunctioned when the received inputs substantially mismatch; and activating an interlock signal in response to the determination of the malfunction.

2. The method of claim 1, wherein the set point input corresponds to status of a set point LED of the power supply.

3. The method of claim 2, wherein the output power input corresponds to status of an output LED of the power supply.

4. An apparatus for activating an interlock signal to represent a malfunction of a power supply system wherein a master power supply is configurable to receive a first set point and to indicate an estimated output for the power supply system, the apparatus comprising:

a first circuit section electrically coupled to the power supply system, wherein the first circuit section is configurable to receive a first signal representing status of a set point of the power supply system and a second signal representing status of an output of the power supply system, wherein the first circuit activates a trigger signal responsive to the first and second signal substantially mismatching; and a second circuit section electrically coupled to the first circuit section, wherein the second circuit section activates the interlock signal in response to receiving the trigger signal.

5. An apparatus according to claim 4, wherein the first signal corresponds to status of a set point LED of the master power supply.

6. An apparatus according to claim 5, wherein the second signal corresponds to status of an output LED of the master power supply.

7. A system comprising:

a processing unit;

memory coupled to the processing unit;

a program comprised in the memory, wherein the program is executable to:

receive inputs representing one or more electrical properties of a power supply system, wherein the power supply system has a master power supply that is configurable to regulate output power for the power supply system in response to receiving a first set point, wherein a first one of the inputs received represents status of the system output power and a second one of the inputs received represents the first set point;

determine that a slave power supply has malfunctioned when the inputs substantially mismatch; and activate an interlock signal in response to the determination of the malfunction.

8. The system according to claim 7, wherein the system comprises a display screen and a keyboard.

9. The system according to claim 8, wherein the first input corresponds to status of a set point LED of the master power supply.

10. The system according to claim 9, wherein the second input corresponds to status of an output LED of the master power supply.

11. A method for activating an interlock signal for a power supply system, the method comprising:

receiving inputs representing one or more electrical properties of the power supply system, wherein a master power supply is configurable to receive a first set point and to indicate an estimated output for the power supply system, and a first one of the inputs represents status of the first set point and a second one of the inputs represents status of the estimated output indication, wherein the set point input corresponds to status of a set point LED of the power supply and the output power input corresponds to status of an output LED of the power supply, wherein the power supply system comprises a master power supply electrically coupled to a slave power supply, wherein the slave power supply is configured to receive a second set point input signal from the master power supply and wherein at least a portion of the output of the power supply system is provided by the slave power supply;

determining that the slave power supply has malfunctioned when the received inputs substantially mismatch; and activating an interlock signal in response to the determination of the malfunction.

12. The method of claim 11 further comprising:

transferring the interlock signal to enable a shut off of the output power of the master-slave power supply system.

13. The method of claim 12, wherein the one or more electrical properties of the power supply system comprise a property from among the following:

power, current and voltage.

14. An apparatus for activating an interlock signal to represent a malfunction of a power supply system wherein a master power supply is configurable to receive a first set point and to indicate an estimated output for the power supply system, the apparatus comprising:

a first circuit section electrically coupled to the power supply system, wherein the first circuit section is configurable to receive a first signal representing status of a set point of the power supply system and a second signal representing status of an output of the power supply system, wherein the first circuit activates a trigger signal responsive to the first and second signal substantially mismatching, wherein the first signal corresponds to status of a set point LED of the master power supply and the second signal corresponds to status of an output LED of the master power supply, wherein the power supply system comprises a master power supply electrically coupled to a slave power supply, wherein the slave power supply is configured to receive a second set point signal from the master power supply and wherein at least a portion of the output of the power supply system is provided by the slave power supply; and a second circuit section electrically coupled to the first circuit section, wherein the second circuit section activates the interlock signal in response to receiving the trigger signal.

15. An apparatus according to claim 14, wherein the interlock signal enables a shut off of the output of the power supply system.

16. An apparatus according to claim 15, wherein the first circuit section comprises a logic control section having an Exclusive OR gate.

17. An apparatus according to claim 16, wherein the second circuit section comprises an interlock trigger section, wherein the interlock trigger section activates the interlock signal in response to receiving the trigger signal.

18. An apparatus according to claim 17, wherein the interlock trigger section comprises a relay, wherein energizing of the relay enables a shut off of the output power of the master-slave power supply system.

19. An apparatus according to claim 18, wherein the second circuit section comprises a time delay section, wherein the time delay section receives the trigger signal and has an output representing the trigger signal coupled to the interlock trigger section, and wherein the time delay section outputs its signal to the interlock trigger section responsive to persistence for a certain time interval of the trigger signal input to the time delay section.

20. A system comprising:

a processing unit;

memory coupled to the processing unit;

a program comprised in the memory, wherein the program is executable to:

receive inputs representing one or more electrical properties of a power supply system, wherein the power supply system has a master power supply that is configurable to regulate output power for the power supply system in response to receiving a first set point, wherein a first one of the inputs received represents status of the system output power and a second one of the inputs received represents the first set point, wherein the system comprises a display screen and a keyboard, wherein the first input corresponds to status of a set point LED of the master power supply, and the second input corresponds to status of an output LED of the master power supply, wherein the slave power supply is configured to receive a second set point signal from the master power supply and wherein at least a portion of the power output of the power supply system is provided by the slave power supply;

determine that a slave power supply has malfunctioned when the inputs substantially mismatch; and activate an interlock signal in response to the determination of the malfunction.

21. The system according to claim 20, wherein the interlock signal enables a shut off of the output power of the master-slave power supply system.

22. The system according to claim 21, wherein the one or more electrical properties of the power supply system comprise a property from among the following: power, current and voltage.

* * * * *